US012757423B2

(12) United States Patent
Maung et al.

(10) Patent No.: US 12,757,423 B2
(45) Date of Patent: Oct. 6, 2026

(54) JUNCTION FIELD EFFECT TRANSISTOR WITH BOTTOM GATE UNDERLYING DRAIN AND OPTIONALLY PARTIALLY UNDERLYING TOP GATE AND METHOD

(71) Applicant: GlobalFoundries Singapore Pte Ltd., Singapore (SG)

(72) Inventors: Myo Aung Maung, Singapore (SG); Khee Yong Lim, Singapore (SG); Thanh Hoa Phung, Singapore (SG); Zar Lwin Zin, Singapore (SG); Ming-Tsang Tsai, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 517 days.

(21) Appl. No.: 18/364,585

(22) Filed: Aug. 3, 2023

(65) Prior Publication Data

US 2025/0048665 A1 Feb. 6, 2025

(51) Int. Cl.
*H10D 30/01* (2025.01)
*H10D 30/60* (2025.01)
(Continued)

(52) U.S. Cl.
CPC ....... *H10D 30/0512* (2025.01); *H10D 30/615* (2025.01); *H10D 62/116* (2025.01); *H10D 64/111* (2025.01)

(58) Field of Classification Search
CPC .. H10D 62/343; H10D 62/328; H10D 62/357; H10D 62/149; H10D 30/83; H10D 30/051; H10D 30/0512; H10D 30/832; H10D 62/116; H10D 64/111; H10D 30/615
See application file for complete search history.

(56) References Cited

U.S. PATENT DOCUMENTS 8,466,501 B2 6/2013 Hershberger et al.
2009/0206375 A1 8/2009 Saha et al.
(Continued)

OTHER PUBLICATIONS

Qiang et al., "A cost-competitive low Noise Junction-FET (JFET) for high-precision Analog Application," 25th International Conference on Noise and Fluctuations (ICNF 2019), 4 pages.

*Primary Examiner* — Jose R Diaz
(74) *Attorney, Agent, or Firm* — Erica Ee; Hoffman Warnick LLC

(57) ABSTRACT

Disclosed are a structure, including a junction field effect transistor (JFET), and a method of forming the structure. The JFET includes a channel region and source and drain regions above the channel region. The JFET also includes a first gate region below the channel region and a second gate region above the channel region positioned laterally between and isolated from the source and drain regions. The first gate region underlies the drain region and is offset from the source region and at least that portion of the second gate region adjacent to the source region. Specifically, the first gate region is either completely offset from both the source region and the second gate region or is completely offset from the source region and only partially underlies the second gate region. In the JFET, resistance on is reduced and saturation drain current is increased without significantly impacting breakdown or pinch-off voltages.

9 Claims, 6 Drawing Sheets

(51) Int. Cl.
*H10D 62/10* (2025.01)
*H10D 64/00* (2025.01)

(56) References Cited

U.S. PATENT DOCUMENTS

2012/0292669 A1* 11/2012 Candra .................. H10D 30/83
257/268
2015/0214384 A1* 7/2015 Shepard ................. H10D 30/83
257/270
2024/0332430 A1* 10/2024 Koga ................... H10D 62/343
2024/0405074 A1* 12/2024 Koga ..................... H10D 30/83

* cited by examiner

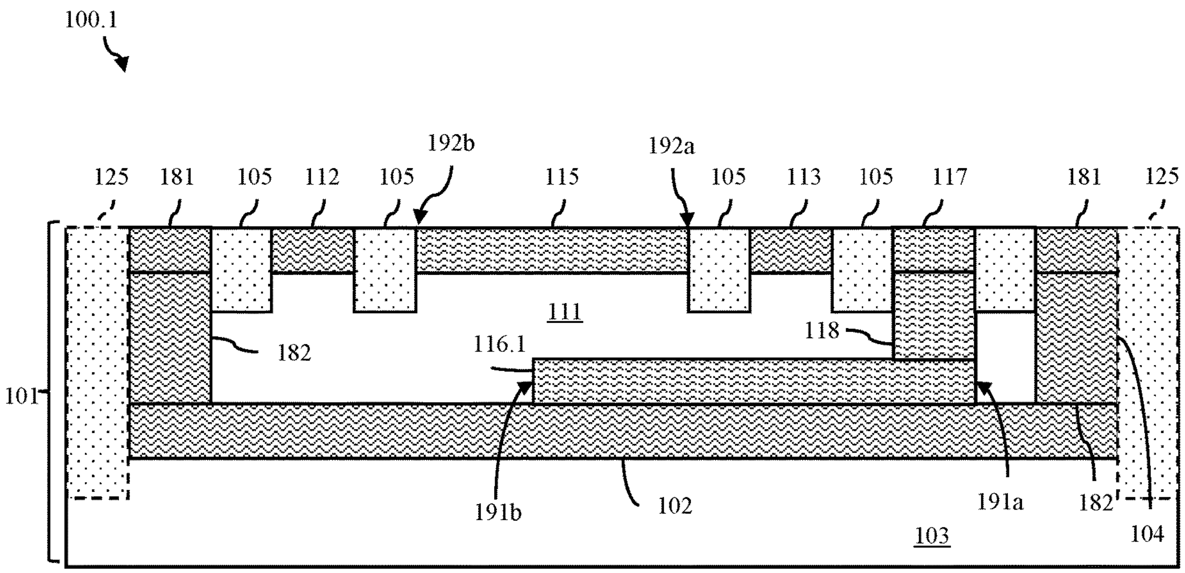
FIG. 1.1
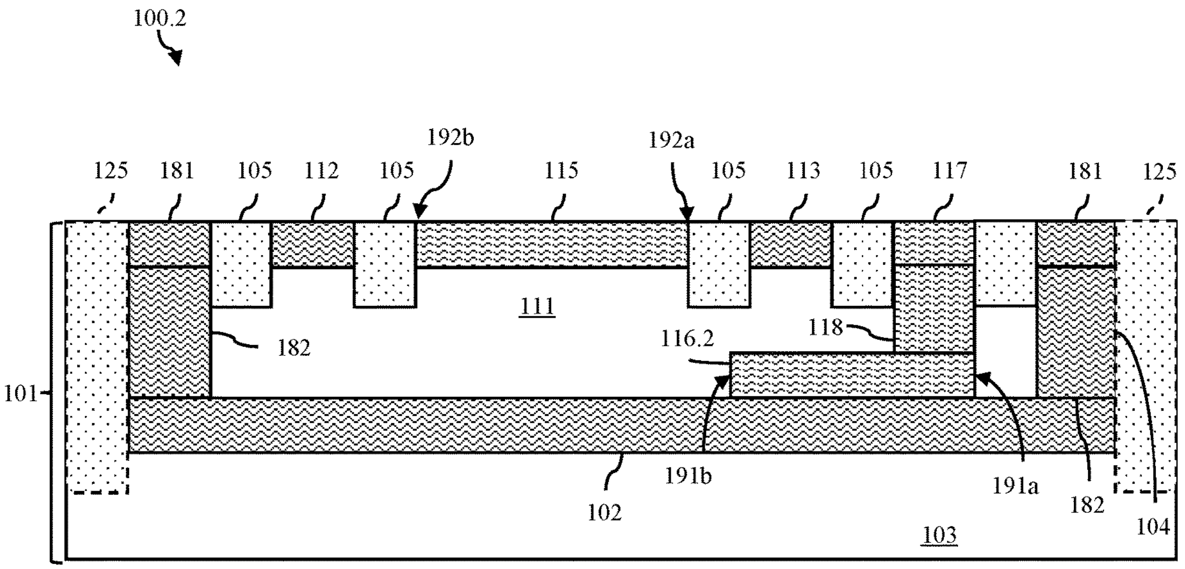
FIG. 1.2

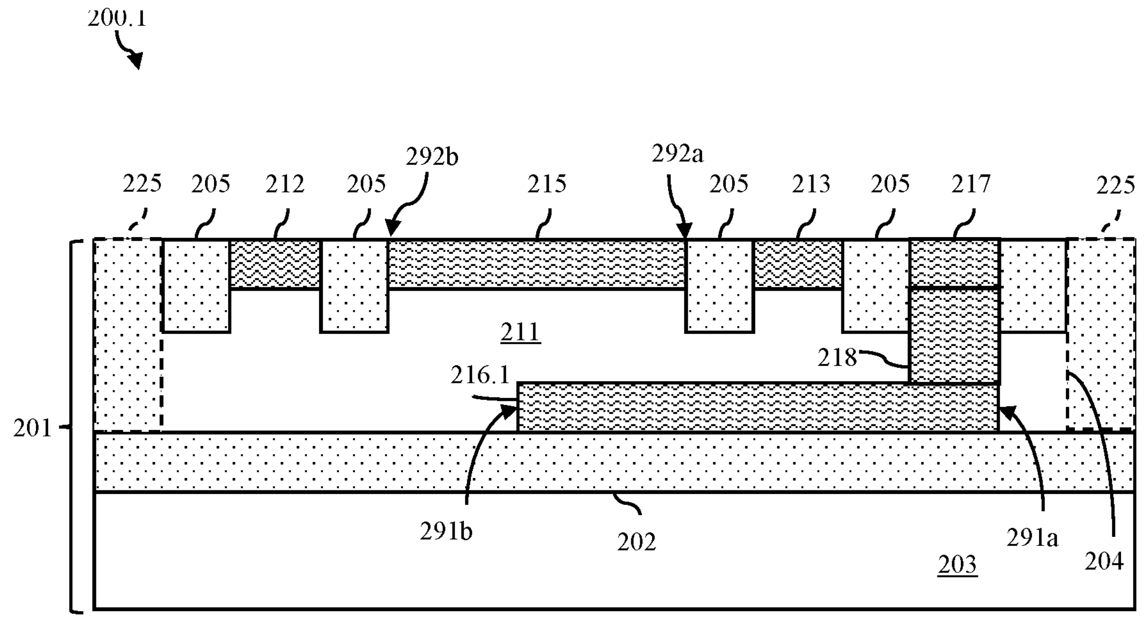
FIG. 2.1
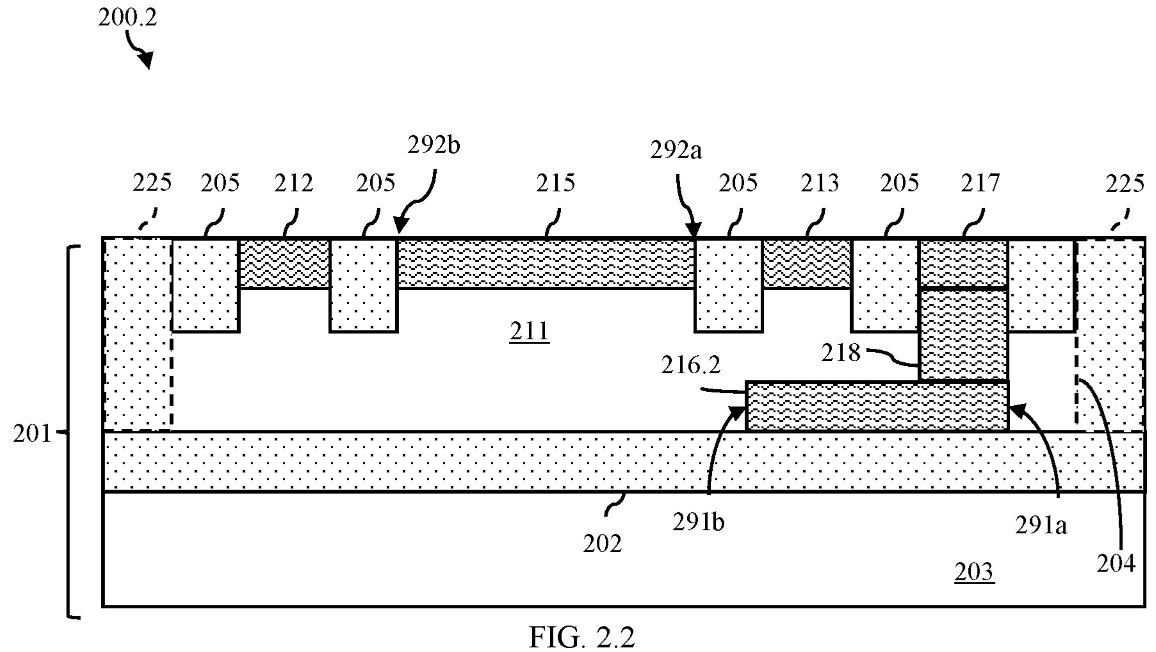
FIG. 2.2

JUNCTION FIELD EFFECT TRANSISTOR WITH BOTTOM GATE UNDERLYING DRAIN AND OPTIONALLY PARTIALLY UNDERLYING TOP GATE AND METHOD

BACKGROUND

The present disclosure relates semiconductor structures and, particularly, to a semiconductor structure including a junction field effect transistor (JFET) and a method of forming the semiconductor structure.

Factors considered in modern IC design include, but are not limited to, performance improvement, size scaling, and power consumption. Oftentimes, however, there is a tradeoff between these factors including, but not limited to, a tradeoff between different performance characteristics. For example, typically design changes made to improve performance characteristics, such as resistance on (Ron) and/or saturation drain current (Idsat), of a JFET will negatively affect other performance characteristics, such as the breakdown voltage (BV) or the pinch-off voltage (Vp), and vice versa.

SUMMARY

Disclosed herein are embodiments of a semiconductor structure. The semiconductor structure can include a semiconductor layer. The semiconductor structure can further include a transistor. The transistor can include the following components within the semiconductor layer: a channel region; a drain region and a source region above the channel region; a first gate region below the channel region; and a second gate region above the channel region positioned laterally between the drain region and the source region. The first gate region can specifically underlie the drain region and be offset from both the source region and at least a portion of the second gate region that is adjacent to the source region.

In some embodiments, the semiconductor structure can specifically be a semiconductor-on-insulator structure. That is, the semiconductor structure can include an insulator layer and a semiconductor layer on the insulator layer. The semiconductor structure can further include a transistor. The transistor can include the following components within the semiconductor layer: a channel region; a drain region and a source region above the channel region; a first gate region between the insulator layer and the channel region; and a second gate region above the channel region positioned laterally between the drain region and the source region. The first gate region can specifically underlie the drain region and be offset from both the source region and at least a portion of the second gate region adjacent to the source region.

Also disclosed herein are method embodiments for forming the above-described semiconductor structures. The method embodiments can include providing a semiconductor layer and forming a transistor. The transistor can be formed such that it includes the following components within the semiconductor layer: a channel region; a drain region and a source region above the channel region; a first gate region below the channel region; and a second gate region above the channel region positioned laterally between the drain region and the source region. It should be noted that these components can be formed specifically so that the first gate region underlies the drain region and is offset from the source region and at least a portion of the second gate region adjacent to the source region.

It should be noted that all aspects, examples, and features of disclosed embodiments mentioned above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 1.1 is a cross-section diagram illustrating an embodiment of a bulk semiconductor structure;

FIG. 1.2 is a cross-section diagram illustrating another embodiment of a bulk semiconductor structure;

FIG. 2.1 is a cross-section diagram illustrating an embodiment of a semiconductor-on-insulator structure;

FIG. 2.2 is a cross-section diagram illustrating another embodiment of a semiconductor-on-insulator structure;

DETAILED DESCRIPTION

Figure 3:
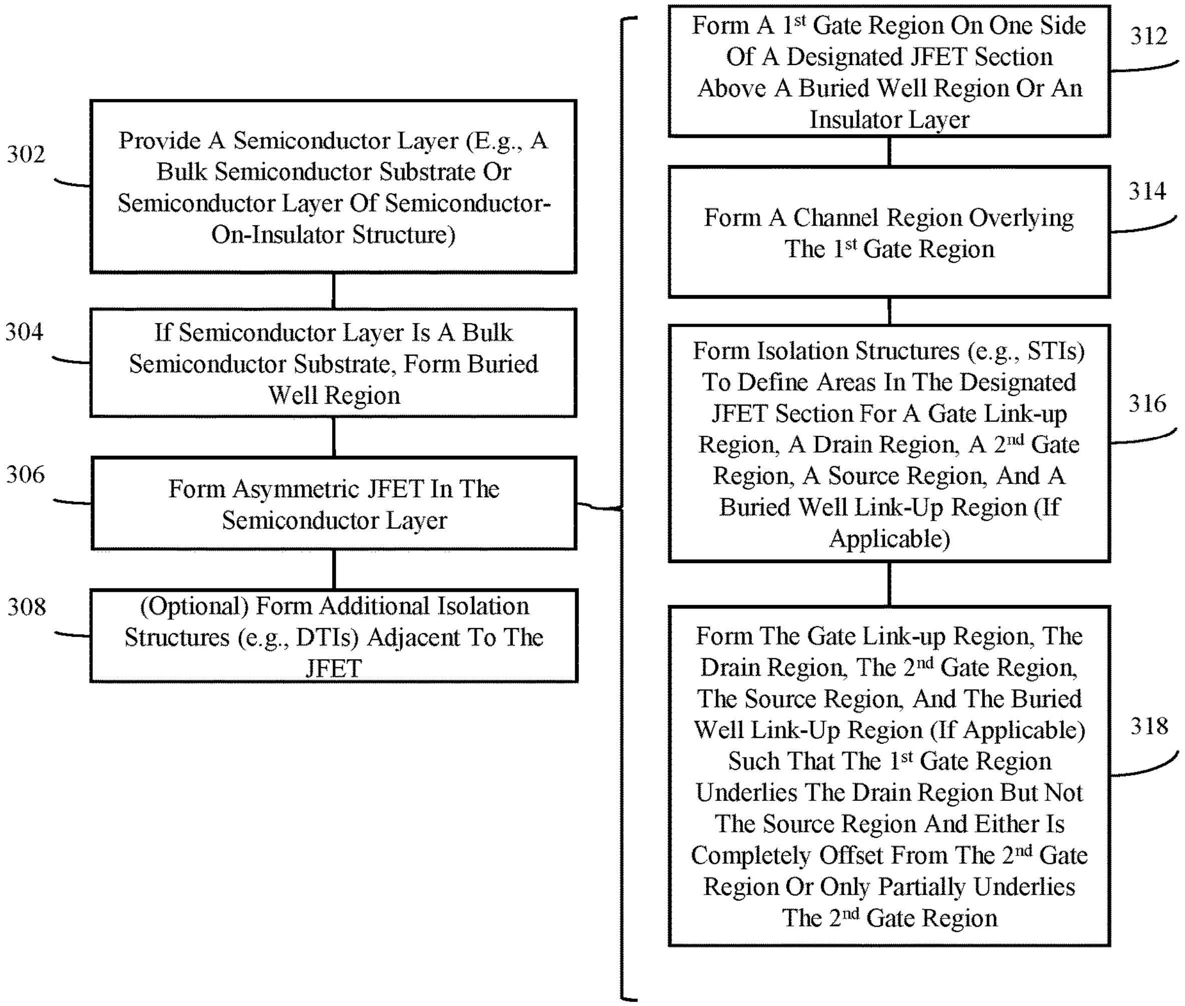
FIG. 3 is a flow diagram illustrating disclosed method embodiments.

As mentioned above, typically design changes made to improve performance characteristics, such as resistance on (Ron) and/or saturation drain current (Idsat), of a JFET will negatively affect other performance characteristics, such as the breakdown voltage (BV) or the pinch-off voltage (Vp), and vice versa.

In view of the foregoing, disclosed herein are embodiments of a semiconductor structure including an asymmetric JFET. The asymmetric JFET can include various components within a semiconductor layer. These components can include a channel region and, above the channel region, a drain region and a source region. A first gate region (also referred to herein as a bottom gate region) is below the channel region and a second gate region (also referred to herein as a top gate region) is above the channel region positioned laterally between and isolated from the drain region and the source region. The first gate region underlies the drain region but not the source region and is further offset from at least a portion of the second gate region adjacent to the source region. For example, in some embodiments, the first gate region can be completely offset from both the source region and the second gate region. In other embodiments, the first gate region can be completely offset from the source region and can only partially underlie the second gate region. In the disclosed embodiments, the semiconductor layer including these JFET components can be a bulk semiconductor substrate (and particularly an upper portion thereof above a buried well region). Alternatively, the semiconductor layer can be the semiconductor layer of a semiconductor-on-insulator structure. In any case, the relative positioning of the first gate region to the drain region, second gate region and source region, as described, results in a JFET with reduced Ron and increased Idsat without a significant impact on BV or Vp (e.g., which can each stay essentially the same +/−0.2 volts (V) or less). Also disclosed herein are method embodiments for forming such semiconductor structures.

More particularly, referring to FIGS. 1.1, 1.2, 2.1, and 2.2, disclosed herein are embodiments of a semiconductor structure that includes an asymmetric JFET 100.1, 100.2, 200.1, and 200.2, respectively, with various components within a semiconductor layer.

As illustrated in FIGS. 1.1 and 1.2, in some embodiments, the semiconductor layer can be a bulk semiconductor substrate 101. The semiconductor substrate 101 can be monocrystalline in structure. The semiconductor substrate can be, for example, a bulk silicon substrate or a bulk substrate of any other suitable semiconductor material (e.g., silicon germanium, etc.). The semiconductor substrate 101 can have a first surface (also referred to herein as a bottom surface) and a second surface (also referred to herein as a top surface) opposite the bottom surface. The semiconductor substrate 101 can further include a buried well region 102. Those skilled in the art will recognize that a well region refers to a dopant implant region within a semiconductor substrate. A dopant implant region refers to a region within which dopants (e.g., N-type dopants or P-type dopants) have been implanted in order to achieve a desired conductivity type and conductivity level. A "buried" well region refers to a well region that is within the substrate and specifically separated from the top and bottom surfaces thereof (e.g., given the dopant implant specification used during formation). Thus, an upper portion 104 of the semiconductor substrate 101 is above the buried well region 102 and a lower portion 103 of the semiconductor substrate 101 is below the buried well region 102. JFET 100.1 or 100.2 can include various components within the upper portion 104 of semiconductor substrate 101. Doping of buried well region 102 is discussed in greater detail below.

As illustrated in FIGS. 2.1 and 2.2, in other embodiments, the semiconductor layer can be a semiconductor layer 204 of a semiconductor-on-insulator structure 201. Specifically, semiconductor-on-insulator structure 201 can include substrate 203. Substrate 203 can be, for example, a semiconductor substrate that is monocrystalline in the structure. For example, substrate 203 could be a silicon substrate, a semiconductor substrate of any other suitable semiconductor material (e.g., silicon germanium, etc.), or a substrate of any other suitable material. Semiconductor-on-insulator structure 201 can further include an insulator layer 202 on substrate 203. Insulator layer 202 can be, for example, a silicon dioxide layer or a layer of any other suitable insulator material (e.g., a different oxide material, a nitride material, etc.). Semiconductor-on-insulator structure 201 can further include a semiconductor layer 204 on insulator layer 202. Semiconductor layer 204 can be monocrystalline in structure and can be, for example, a silicon layer (e.g., in the case of a silicon-on-insulator (SOI) structure) or a layer of any other suitable semiconductor material (e.g., silicon germanium, etc.). JFET 200.1 or 200.2 can include various components within semiconductor layer 204 above insulator layer 202.

Referring to FIGS. 1.1-1.2 and 2.1-2.2, in each of the embodiments, JFET 100.1, 100.2, 200.1, 200.2 can include a channel region 111, 211 in the semiconductor layer 104, 204 (i.e., above the buried well region 102 or insulator layer 202, as applicable). Channel region 111, 211 can have a first type conductivity. Specifically, channel region 111, 211 can be a doped portion of semiconductor layer 104, 204 that extends to buried well region 102 or insulator layer 202, as applicable. The doped portion of the semiconductor layer can, for example, be a dopant implant region. It should be noted that in JFET 100.1, 100.2 of FIGS. 1.1-1.2, the buried well region 102 can also have the first type conductivity, but at a higher conductivity level than the channel region 111.

JFET 100.1, 100.2, 200.1, 200.2 can further include a drain region 113, 213 and a source region 112, 212 at the top surface of semiconductor layer 104, 204 above and immediately adjacent to channel region 111, 211. Drain region 113, 213 and source region 112, 212 can have the first type conductivity at a higher conductivity level than channel region 111, 211. Drain region 113, 213 and source region 112, 212 can be doped portions of semiconductor layer 104, 204. These doped portions can, for example, be dopant implant regions. Alternatively, drain region 113, 213 and source region 112, 212 can be doped epitaxial semiconductor layers (e.g., which are within shallow trenches in the top surface of the semiconductor layer 104, 204 adjacent to the channel region 111, 211).

Drain region 113, 213 and source region 112, 212 can be positioned laterally between isolation structures 105, 205. Isolation structures 105, 205 can, for example, be trench isolation structures, such as shallow trench isolation (STI) structures. STI structures can include shallow trenches, which extend into the top surface of the semiconductor substrate, and which are filled with one or more isolation materials. Such isolation materials can include, but are not limited to, silicon dioxide, silicon oxynitride, silicon nitride and/or any other suitable isolation material(s). It should be noted that the depth of isolation structures 105, 205 can be equal to or greater than the depths of the drain and source regions but less than that of the channel region. Thus, the isolation structures 105, 205 do not extend completely through channel region 111, 211 to buried well region 102 or insulator layer 202, as applicable.

JFET 100.1, 100.2, 200.1, 200.2 can further include a first gate region 116.1 or 116.2, 216.1 or 216.2 (also referred to herein as a bottom gate region) below the channel region 111, 211 and a second gate region 115, 215 (also referred to herein as a top gate region) above the channel region 111, 211. The first gate region 116.1 or 116.2, 216.1 or 216.2 and second gate region 115, 215 can each have a second type conductivity (different from the first type conductivity) at a relatively high conductivity level.

The second gate region 115, 215 has opposing sidewalls 192*a*-192*b*, 292*a*-292*b*, is positioned laterally between drain region 113, 213 and source region 112, 212, and is electrically isolated from the drain and source regions by isolation structures 105, 205. Second gate region 115, 215 can be a doped portion of semiconductor layer 104, 204. This doped portion can, for example, be a dopant implant region. Alternatively, second gate region 115, 215 can be a doped epitaxial semiconductor layer (e.g., which is within a shallow trench in the top surface of the semiconductor layer adjacent to the channel region 111, 211). The depth of isolation structures 105, 205 can be equal to or greater than the depth of second gate region 115, 215.

First gate region 116.1 or 116.2, 216.1 or 216.2 has opposing ends 191*a*-191*b*, 291*a*-291*b* and is above and, optionally, immediately adjacent to the buried well region 102 or insulator layer 202, as applicable. First gate region 116.1 or 116.2, 216.1 or 216.2 can be a doped portion of semiconductor layer 104, 204. This doped portion can, for example, be a dopant implant region. Alternatively, the first gate region 116.1 or 116.2 could be a doped epitaxial semiconductor layer (e.g., at the bottom of a deep trench below additional epitaxial semiconductor fill material).

First gate region 116.1 or 116.2, 216.1 or 216.2 can underlie drain region 113, 213. First gate region 116.1 or 116.2, 216.1 or 216.2 can be completely offset from source region 112, 212 and can further be offset from at least that portion of second gate region 115, 215 adjacent to source region 112, 212. Specifically, the first gate region 116.1 or 116.2, 216.1 or 216.2 underlies drain region 113, 213. For example, an end 191*a*, 291*a* of the first gate region 116.1 or 116.2, 216.1 or 216.2 can be vertically aligned with a sidewall of the drain region 113, 213 farthest from the second gate region 115, 215 (as illustrated) or can be somewhat offset in either direction from that sidewall. The first gate region 116.1 or 116.2, 216.1 or 216.2 can further extend laterally from the end 191*a*, 291*a* below the drain region 113, 213 toward second gate region 115, 215. In some embodiments (e.g., see FIGS. 1.2 and 2.2), first gate region 116.2, 216.2 does not underlie second gate region 115, 215 or source region 112, 212 at all (i.e., it is completely offset from both second gate region 115, 215 and source region 112, 212). In this case, the opposite end 191*b*, 291*b* of first gate region 116.2, 216.2 can be aligned vertically with the sidewall of the drain region 113, 213 proximal to the second gate region 115, 215 (not shown) or can be below the isolation structure 105, 205 that is positioned laterally between second gate region 115, 215 and drain region 113, 213 (as illustrated). In other embodiments (e.g., see FIGS. 1.1 and 2.1), first gate region 116.1, 216.1 partially underlies second gate region 115, 215 but is completely offset from source region 112, 212. In this case, end 191*b*, 291*b* of first gate region 116.1, 216.1 is below second gate region 115, 215 and separated laterally from the opposing sidewalls 192*a*-192*b*, 292*a*-292*b* of the second gate region 115, 215. For example, end 191*b*, 291*b* of first gate region 116.1, 216.1 can be centered on the second gate region 115, 215. Alternatively, end 191*b*, 291*b* of first gate region 116.1, 216.1 could be closer to one of the opposing sidewalls 192*a*-192*b*, 292*a*-292*b* of the second gate region 115, 215 than the other. That is, the lateral distances between end 191*b*, 291*b* of the first gate region 116.1, 216.1 and each of the sidewalls 192*a*-192*b*, 292*a*-292*b* of the second gate region 115, 215 could be different.

With this configuration, a first portion of channel region 111, 211 on a first side of JFET 100.1, 100.2, 200.1, 200.2 extends vertically from at least drain region 113, 213 to first gate region 116.1 or 116.2, 216.1 or 216.2. A second portion of channel region 111, 211 on a second side of JFET 100.1, 100.2, 200.1, 200.2 is positioned laterally adjacent to the first portion and to first gate region 116.1 or 116.2, 216.1 or 216.2 and extends vertically from source region 112, 212 and at least the portion of the second gate region 115, 215 adjacent to the source region down to buried well region 102 or insulator layer 202, as applicable.

First gate region 116.1 or 116.2, 216.1 or 216.2 can also extend laterally in the opposite direction (i.e., away from the second gate region) beyond drain region 113, 213 and further beyond an adjacent isolation structure so as to be in contact with a gate link-up region 117-118, 217-218, as discussed in greater below. Specifically, JFET 100.1, 100.2, 200.1, 200.2 can further include a gate link-up region 117-118, 217-218, which has the second type conductivity, and which extends into the semiconductor layer (i.e., into upper portion 104 of semiconductor substrate 101 in FIGS. 1.1-1.2 or into semiconductor layer 204 of the semiconductor-on-insulator structure of FIGS. 1.2, 2.2) from the top surface down to the first gate region 116.1 or 116.2, 216.1 or 216.2 to enable first gate region biasing. The gate link-up region 117-118, 217-218 must be on the drain side of JFET 100.1, 100.2, 200.1, 200.2 so as to be positioned laterally adjacent drain region 113, 213 (but separated therefrom by an isolation structure 105, 205), so as to be positioned laterally immediately adjacent to channel region 111, 211, and so as to either land on first gate region 116.1 or 116.2, 216.1 or 216.2 (as illustrated) or be positioned laterally immediately adjacent to first gate region 116.1 or 116.2, 216.1 or 216.2. Gate link-up region 117-118, 217-218 can include, for example, a gate contact region 117, 217 at the top surface of semiconductor layer 104, 204 and an additional gate contact region 118, 218 extending from the gate contact region 117, 217 down to the first gate region. Gate contact region 117, 217 and additional gate contact region 118, 218 can be doped portions of the semiconductor layer 104, 204 (e.g., with the gate contact region having a higher conductivity level than the additional gate contact region). Alternatively, gate contact region 117, 217 could be a doped epitaxial semiconductor layer (e.g., which is within a shallow trench in the top surface of the semiconductor layer 104, 204) and additional gate contact region 118, 218 could be a doped portion of the semiconductor layer 104, 204 (e.g., a well region). Alternatively, the gate link-up region can include a trench, which extends vertically to the first gate region, and which is filled with conductive material (e.g., in situ doped epitaxial semiconductor material).

Additionally, in the embodiments shown in FIGS. 1.1-1.2, JFET 100.1, 100.2 can further include a well link-up region 181-182, which has the first type conductivity, and which extends into semiconductor layer 104 from the top surface down to buried well region 102. Well link-up region 181-182 can, for example, laterally surround the JFET 100.1, 100.2 and can land on buried well region 102, as illustrated, or be positioned laterally immediately adjacent to ends of buried well region 102 to provide isolation for the JFET from the lower portion of the substrate below and from adjacent devices. Optionally, buried well region 102 could be biased via well link-up region 181-182 (e.g., in order to bias the channel region and adjust the threshold voltage (VT) of the JFET 100.1, 100.2). Well link-up region 181-182 can include, for example, a well contact region 181 at the top surface of semiconductor layer 104 and an additional well contact region 182 extending from well contact region 181 down to buried well region 102. Well contact region 181 and additional well contact region 182 can be doped portions of semiconductor layer 104, 204 (e.g., with the well contact region having a higher conductivity level than the additional well contact region). Alternatively, well contact region 181 could be a doped epitaxial semiconductor layer (e.g., which is within a shallow trench in the top surface of semiconductor layer 104) and additional well contact region 182 could be a doped portion of the semiconductor layer 104 (e.g., another well region). Alternatively, the well link-up region can include a trench, which extends vertically to buried well region 102 and which is filled with conductive material (e.g., in situ doped epitaxial semiconductor material).

As discussed above, the various components of JFET 100.1, 100.2, 200.1, 200.2 (e.g., drain region, source region, channel region, first and second gate structures, link-up regions, etc.) can be doped regions within the semiconductor layer and/or doped epitaxial semiconductor layers within trenches in the semiconductor layer. It should be understood, however, that the specific examples provided are for illustration purposes and not intended to be limiting. Alternatively, any other suitable combination of doped regions and/or doped epitaxial semiconductor layers could be employed to form the JFET components (e.g., drain region, source region, channel region, first and second gate structures, link-up regions, etc.) as long as those components are arranged relative to each other, as described above and illustrated in the figures.

In any case, within JFET 100.1, 100.2, 200.1, 200.2, drain region 113, 213, source region 112, 212, channel region 111, 211 and, if applicable, buried well region 102 and well link-up region 181-182 have the first type conductivity. Furthermore, first gate region 116.1 or 116.2, 216.2 or 216.2, gate link-up region 117-118, 217-218, and second gate region 115, 215 have the second type conductivity that is different from the first type conductivity. In the disclosed embodiments, JFET 100.1, 100.2, 200.1, 200.2 could be either an N-channel JFET or a P-channel JFET. It should be understood that the first and second type conductivities will vary depending upon whether JFET 100.1, 100.2, 200.1, 200.2 is an N-channel JFET or a P-channel JFET.

For an N-channel JFET, drain region 113, 213, source region 112, 212, channel region 111, 211 and, if applicable, buried well region 102 and well link-up region 181-182 will have N-type conductivity. First gate region 116.1 or 116.2, 216.2 or 216.2, gate link-up region 117-118, 217-218, and second gate region 115, 215 will have P-type conductivity. For example, for an N-channel JFET, the drain and source regions can be N++ source/drain regions, the channel region can be an N-channel region and, if applicable, the buried well region can be a buried Nwell and the well link-up region can be an N-type link-up region (e.g., including an N++ contact region on an N+ well region that extends down to the buried Nwell). Additionally, the first and second gate regions can be P+ gate regions and the gate link-up region can be a P-type link-up region (e.g., including a P++ contact region on a P+ well region that extends down to the P+ gate region).

For a P-channel JFET, drain region 113, 213, source region 112, 212, channel region 111, 211 and, if applicable, buried well region 102 and well link-up region 181-182 will have P-type conductivity. First gate region 116.1 or 116.2, 216.2 or 216.2, gate link-up region 117-118, 217-218, and second gate region 115, 215 will have N-type conductivity. For example, for a P-channel JFET, the drain and source regions can be P++ source/drain regions, the channel region can be a P-channel region and, if applicable, the buried well region can be a buried Pwell and the well link-up region can be a P-type link-up region (e.g., including a P++ contact region on a P+ well region that extends down to the buried Pwell). Additionally, the first and second gate regions can be N+ gate regions and the gate link-up region can be an N-type link-up region (e.g., including an N++ contact region on an N+ well region that extends down to the N+ gate region). Furthermore, for a P-channel JFET specifically on a bulk semiconductor substrate 101 (e.g., FIGS. 1.1 and 1.2) either: (a) the entire lower portion 103 of the semiconductor substrate 101 below the buried well region 102 (which has P-type conductivity) can have N-type conductivity or (b) the lower portion 103 of the semiconductor substrate can have P-type conductivity and the structure can further include a buried Nwell (not shown) within the substrate between the buried well region 102 and the lower portion 103.

Optionally, additional isolation structures 125, 225 can be positioned laterally adjacent to JFET 100.1, 100.2, 200.1, 200.1 Additional isolation structures 125, 225 can be, for example, deep trench isolation (DTI) structures. DTI structures can include trenches, which extend from the top surface of the semiconductor layer down to or through buried well region 102 or insulator layer 202, as applicable. The trenches of the DTI structures 125, 225 can specifically extend deeper into the structure than the trenches of the STI structures 105, 205, discussed above. The trenches of the DTI structures 125, 225 can be filled with one or more isolation materials. The isolation material(s) of the DTI structures can be the same or different from the isolation materials of the STI structures, discussed above. Additional isolation structures 125, 225 isolation structures 125, 225 can, for example, laterally surround the JFET 100.1, 100.2, 200.1, 200.2.

In the semiconductor structures disclosed herein and, particularly, within JFET 100.1, 100.2, 200.1, 200.2, the relative positioning of the first gate region to the drain region, second gate region and source region, as described, results in reduced Ron and increased Idsat without a significant impact on BV or Vp (e.g., which can each stay essentially the same +/−0.2 volts (V) or less).

Referring to the flow diagram of FIG. 3, also disclosed herein are method embodiments for forming a semiconductor structure having an asymmetric JFET, as described in detail above and illustrated in FIGS. 1.1, 1.2, 2.1, and 2.2.

Figure 4:
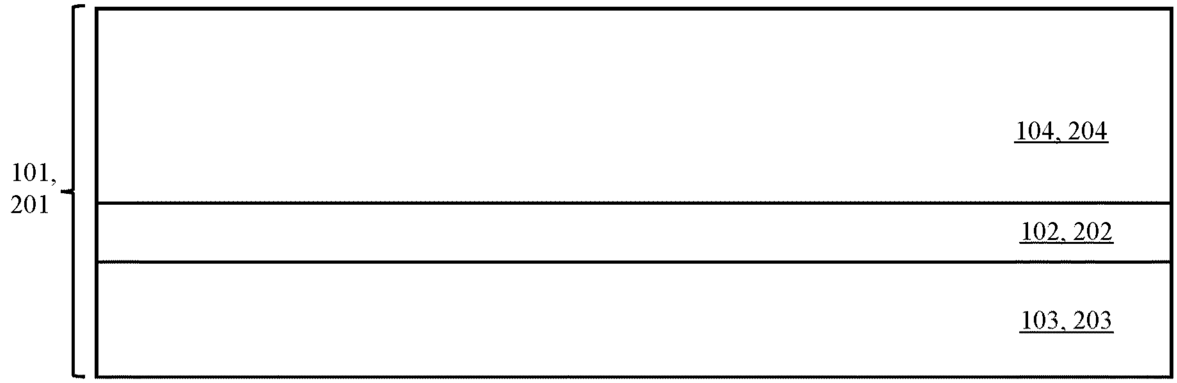
FIGS. 4-7 are cross-section diagrams illustrating partially completed semiconductor structures formed according to the flow diagram of FIG. 3.
Figure 5:
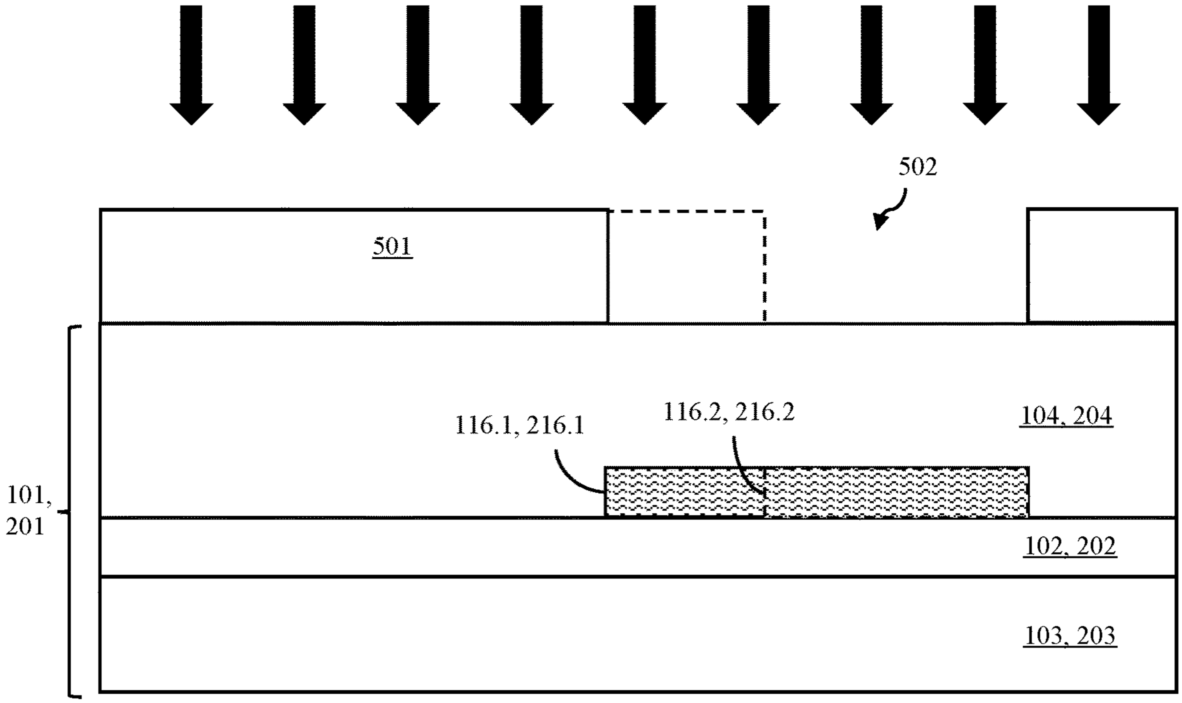

The method can begin with a semiconductor layer (see process 302 and FIG. 4). The semiconductor layer can be a bulk semiconductor substrate 101. The semiconductor substrate 101 can be monocrystalline in structure. The semiconductor substrate can be, for example, a bulk silicon substrate or a bulk substrate of any other suitable semiconductor material (e.g., silicon germanium, etc.). Alternatively, the semiconductor layer can be semiconductor layer 204 of a semiconductor-on-insulator structure 201. Specifically, semiconductor-on-insulator structure 201 can include substrate 203. Substrate 203 can be, for example, a semiconductor substrate that is monocrystalline in the structure. For example, substrate 203 could be a silicon substrate, a semiconductor substrate of any other suitable semiconductor material (e.g., silicon germanium, etc.), or a substrate of any other suitable material. Semiconductor-on-insulator structure 201 can further include an insulator layer 202 on substrate 203. Insulator layer 202 can be, for example, a silicon dioxide layer or a layer of any other suitable insulator material (e.g., a different oxide material, a nitride material, etc.). Semiconductor-on-insulator structure 201 can further include a semiconductor layer 204 on insulator layer 202. Semiconductor layer 204 can be monocrystalline in structure and can be, for example, a silicon layer (e.g., in the case of a silicon-on-insulator (SOI) structure) or a layer of any other suitable semiconductor material (e.g., silicon germanium, etc.). JFET 200.1 or 200.2 can include various components within semiconductor layer 204 above insulator layer 202. If the semiconductor layer of process 302 is a bulk semiconductor substrate 101, then the method can further include forming a buried well region 102 with a first type conductivity within the semiconductor substrate (e.g., using a dopant implantation process) (see process 304).

Optionally, at process 304, an additional buried well region (not shown) with the second type conductivity can be formed to isolate the buried well region 102 from the lower portion 103 of the semiconductor substrate below (e.g., if the buried well region 102 and the lower portion 103 have the same first type conductivity). This is typically the case with a P-channel JFET on a P-semiconductor substrate, where the buried well region 102 is a buried Pwell region and a buried Nwell region is formed to isolate the buried Pwell region from P-lower portion of the semiconductor substrate.

The method can further include forming an asymmetric JFET in a designated section of the semiconductor layer (see process 306). For example, JFET 100.1 of FIG. 1.1 or JFET 100.2 of FIG. 1.2 can be formed at process 306 in a designated section of the upper portion 104 of a bulk semiconductor substrate 101. Alternatively, JFET 200.1 of FIG. 2.1 or JFET 200.2 of FIG. 2.2 can be formed at process 306 in a designated section of semiconductor layer 204 of a semiconductor-on-insulator structure 201.

For example, a first gate region 116.1 or 116.2, 216.1 or 216.2 can be formed on one side of the designated section (see process 312). For example, a mask layer 501 can be formed over the semiconductor layer 104, 204 and patterned (e.g., using conventional lithographic patterning an etch techniques) so as to have an opening 502, which is above the desired location of the first gate region, and which has the desired two-dimensional size and shape of the first gate region. Subsequently, a dopant implantation process can be performed in order to form a first gate region with the second type conductivity within the semiconductor layer 104, 204 some distance below the top surface and adjacent to the buried well region 102 or insulator layer 202, as applicable. It should be understood that by adjusting the size and shape of the opening 502, the size and shape of the first gate region can be adjusted. For example, a smaller opening 502 can ensure that the final JFET structure 100.2, 200.2 has a first gate region 116.2, 216.2 that underlies a drain region but is completely offset from a second gate region and source region, whereas a larger opening 502 can ensure that the final JFET structure 100.1, 200.2 has a first gate region 116.1, 216.1 that underlies a drain region and only partially underlies a second gate region but is still completely offset from a source region. Alternatively, any other suitable technique could be employed at process 312 to form the first gate region with the second type conductivity (e.g., using the mask layer 501 with opening 502).

Figure 6:
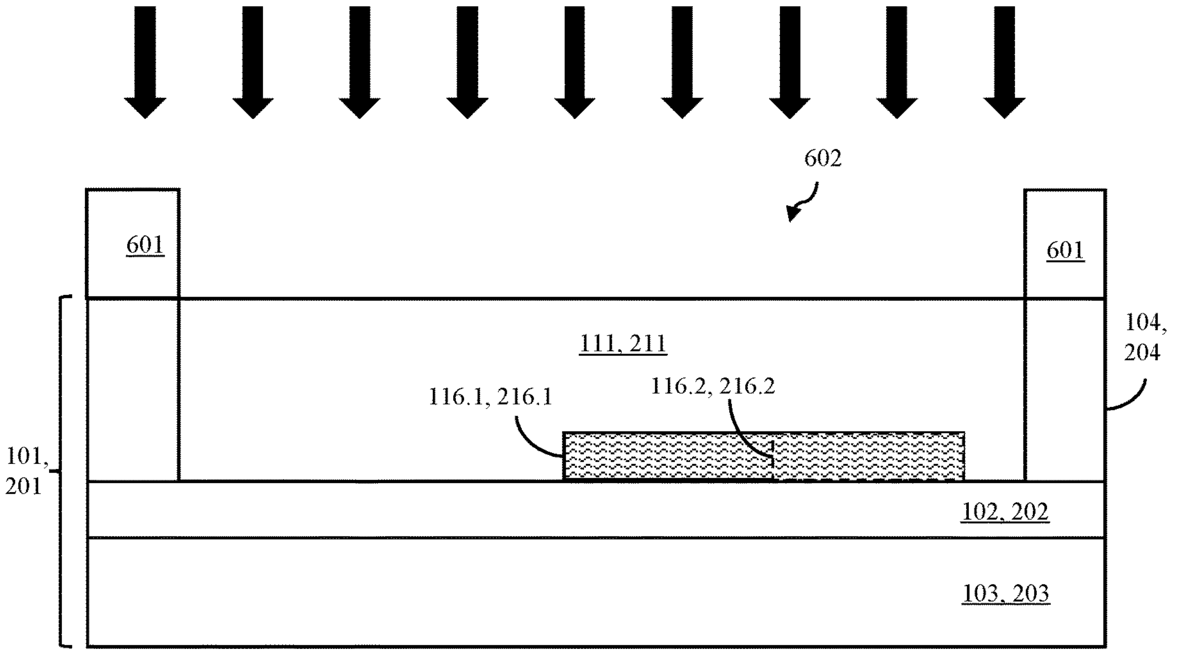

Channel region 111, 211 can be formed in the designated section overlying the first gate region 116.1 or 116.2, 216.1, 216.2 (see process 314 and FIG. 6). For example, mask layer 501 can be selectively removed. Another mask layer 601 can be formed over the partially completed structure and patterned (e.g., lithographically patterned and etched) with an opening 602 to define a channel area. Subsequently, a dopant implantation process can be performed in order to form channel region 111, 211 with the first type conductivity at a relatively low conductivity level within the semiconductor layer 104, 204 extending from the top surface to the buried well region 102 or insulator layer 202, as applicable, and over the first gate region 116.1 or 116.2, 216.1, 216.2. It should be noted that the dopant implantation specifications for forming the first gate region at process 312 and for forming the channel region at process 314 should be selected so that following formation of the channel region 111, 211 (with the second type conductivity at the relatively low conductivity level), the first gate region 116.1 or 116.2, 216.1, 216.2 retains the desired second type conductivity at the relatively high conductivity level. Alternatively, any other suitable technique could be employed at process 314 to form the channel region with the first type conductivity (e.g., using the mask layer 601 with opening 602).

Figure 7:
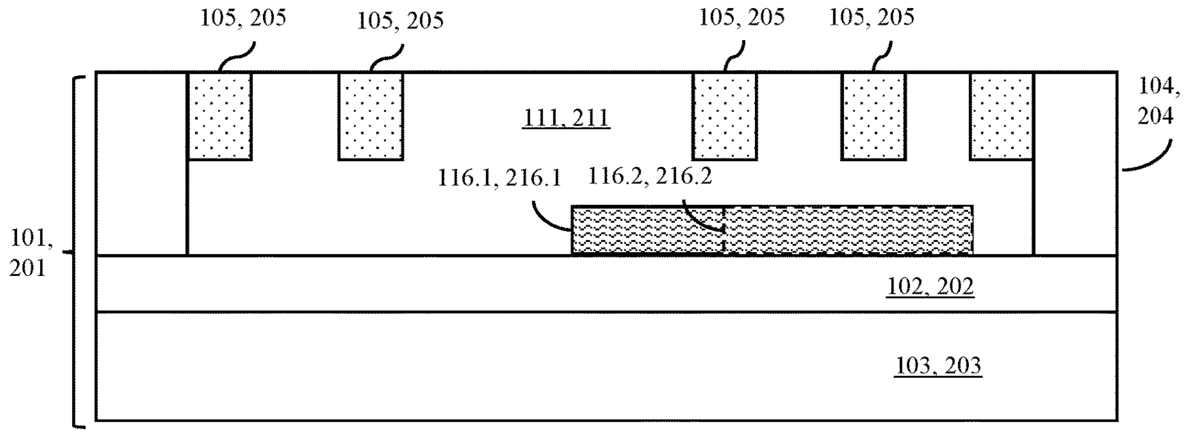

Isolation structures 105, 205 can be formed in the top surface of the semiconductor layer 104, 204 (see process 316 and FIG. 7). The isolation structures 105, 205 can define areas within the designated section for a gate link-up region (which will extend vertically to the first gate region), a drain region (which will be positioned laterally adjacent but electrically isolated from the gate link-up region at the top surface of the semiconductor layer and which will overlie the first gate region), a second gate region (which will be positioned laterally adjacent but electrically isolated from the drain region at the top surface of the semiconductor layer and which may partially overlie the first gate region), and a source region (which will be positioned laterally adjacent but electrically isolated from the second gate region at the top surface of the semiconductor layer and which will not overlie the first gate region). If applicable, such isolation structures 105, 205 can also define an area for a well link-up region that will laterally surround the JFET and extend vertically to the buried well region 102. Isolation structures 105, 205 can, for example, be formed as trench isolation structures, such as shallow trench isolation (STI) structures (e.g., using conventional STI formation techniques). For example, trenches can be formed (e.g., lithographically patterned and etched) such that they extend into the top surface of the semiconductor layer. The trenches can be etched such that they are relatively shallow in depth and, specifically, such that they extend only partially through the channel region. One or more layers of isolation materials (e.g., silicon dioxide, silicon oxynitride, silicon nitride and/or any other suitable isolation material(s)) can be deposited so as to fill the trenches. Subsequently, a polishing process (e.g., a conventional chemical mechanical polishing (CMP) process) can be performed in order to remove isolation material(s) from the top surface of the semiconductor layer.

Figure 8A:
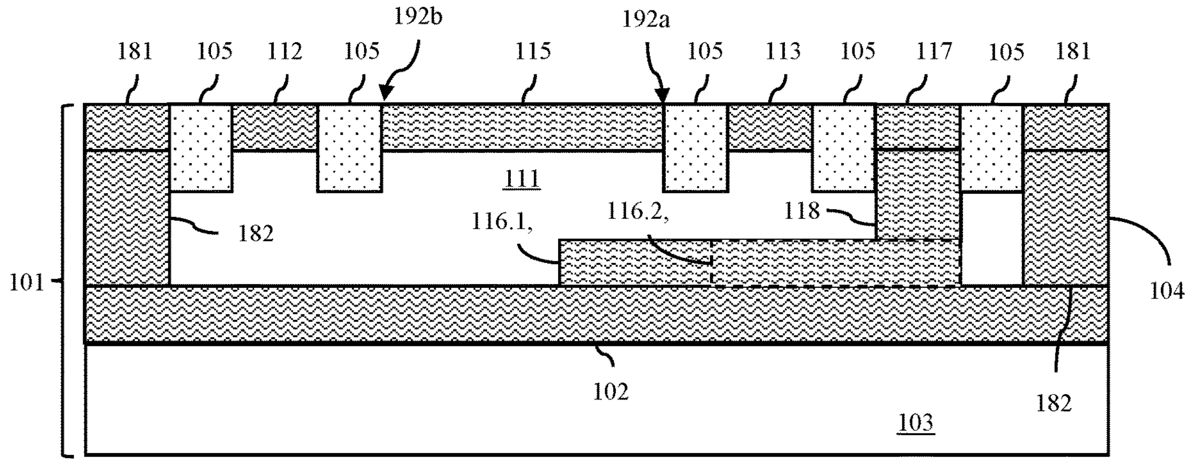
FIG. 8A is a cross-section diagram illustrating specifically a partially completed bulk semiconductor structure formed according to the flow diagram of FIG. 3.
Figure 8B:
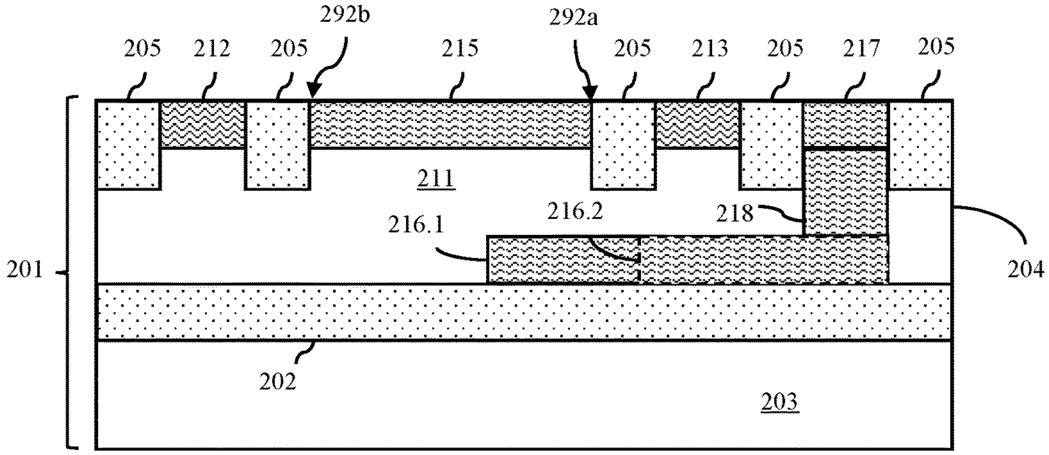
FIG. 8B is a cross-section diagram illustrating specifically a partially completed semiconductor-on-insulator structure formed according to the flow diagram of FIG. 3.

A gate link-up region (including, for example, a gate contact region 117, 217 on an additional gate contact region 118, 218), drain region 113, 213, second gate region 115, 215, source region 112, 212, and, if applicable, well link-up region (including, for example, a well contact region 181 on an additional well contact region 182) can be formed within the designated areas for such regions as defined by the isolation structures 105, 205 at process 316 (see process 318 and FIGS. 8A-8B above). Drain region 113, 213 and source region 112, 212 can be formed to have the first type conductivity and to extend from the top surface of the semiconductor layer to a depth that is equal to or less than the depth of the isolation structures 105, 205. Second gate region 115, 215 can be formed to have the second type conductivity and to extend from the top surface of the semiconductor layer to a depth that is equal to or less than the isolation structures 105, 205. Gate link-up region 117-118, 217-218 can be formed to have the second type conductivity and to extend from the top surface of the semiconductor layer to the first gate region 116.1 or 116.2, 216.1 or 216.2. If applicable, the well link-up region 181-182 can be formed to have the first type conductivity and to extend from the top surface of the semiconductor layer to the buried well region 102.

The above-described regions could be formed at process 318 using various masked dopant implantation processes in order to achieve the desired conductivity types and levels within the specific regions. Techniques for doping different portions of a semiconductor layer with different conductivity types and/or levels (e.g., via masked dopant implantation processes) are known in the art and, thus, there details thereof have been omitted form this specification in order to allow the reader to focus on the salient aspects of the disclosed embodiments. Alternatively, the above-described regions could be formed at process 318 using a combination of masked dopant implantation processes and in situ doped epitaxial semiconductor-filled trench processing. For example, following masked dopant implantation processes to form a buried well region 102 (if applicable), first gate region 116.1 or 116.2, 216.1 or 216.2, channel region 111, 211, additional gate contact region 118, 218, and additional well contact region 182 (if applicable), trenches can be patterned (e.g., lithographically) and etched into designated areas at the top surface of the semiconductor layer for drain region 113, 213, source region 112, 212, and well contact region 181 (if applicable). These trenches can then be filled with in situ doped epitaxial semiconductor material so as to have the first type conductivity. Trenches can also be patterned (e.g., lithographically) and etched into designated areas at the top surface of the semiconductor layer for second gate region 115, 215 and gate contact region 117, 217. These trenches can then be filled with in situ doped epitaxial semiconductor material so as to have the second type conductivity. Alternatively, any other suitable process can be employed to form the doped semiconductor components of the transistor, as described above, at process 318.

Optionally, additional isolation structures 125, 225 can be formed adjacent to JFET 100.1, 100.2, 200.1, 200.1 (see process 308 and FIGS. 1.1, 1.2, 2.1, and 2.2). For example, at process 308, deep trench isolation (DTI) structures can be formed using conventional DTI formation techniques. Specifically, one or more deep trenches can be formed (e.g., lithographically patterned and etched) such that they extend from the top surface of the semiconductor layer to or through the buried well region 102 or insulator layer 202, as applicable. The deep trench(es) can specifically be etched so as to extend deeper into the partially completed semiconductor structure than the relatively shallow trenches of the STI structures discussed above. The trench(es) can be patterned so that they are positioned laterally adjacent to the JFET and, in some embodiments, so that they laterally surround the JFET. One or more layers of isolation materials (e.g., silicon dioxide, silicon oxynitride, silicon nitride and/or any other suitable isolation material(s)) can be deposited so as to fill the trench(es). The isolation material(s) can be the same as or different from the isolation material(s) of the STI structures. Subsequently, a polishing process (e.g., a conventional CMP process) can be performed in order to remove isolation material(s) from the top surface of the semiconductor layer.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms “a,” “an” and “the” are intended to include the plural forms as well, unless the context clearly indicates otherwise. Additionally, as used herein, the terms “comprises,” “comprising,” “includes” and/or “including” specify the presence of stated features, integers, steps, operations, elements, and/or components, but do not preclude the presence or addition of one or more other features, integers, steps, operations, elements, components, and/or groups thereof. Furthermore, as used herein, terms such as “right,” “left,” “vertical,” “horizontal,” “top,” “bottom,” “upper,” “lower,” “under,” “below,” “underlying,” “over,” “overlying,” “parallel,” “perpendicular,” etc., are intended to describe relative locations as they are oriented and illustrated in the drawings (unless otherwise indicated) and terms such as “touching,” “in direct contact,” “abutting,” “directly adjacent to,” “immediately adjacent to,” etc., are intended to indicate that at least one element physically contacts another element (without other elements separating the described elements). The term “laterally” is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a semiconductor layer, wherein the semiconductor layer is a semiconductor substrate;

a transistor including, within the semiconductor layer:

a channel region;

a drain region and a source region above the channel region;

a first gate region below the channel region; and a second gate region above the channel region positioned laterally between the drain region and the source region, wherein the first gate region underlies the drain region and is offset horizontally from the source region and at least a portion of the second gate region adjacent to the source region; and a buried well region within the semiconductor substrate, wherein on the buried well region, the channel region is positioned laterally adjacent to the first gate region and further extends over the first gate region.

2. The structure of claim 1, further comprising isolation structures between the second gate region and the source region and the drain region.

3. The structure of claim 1, wherein the first gate region is completely offset from the source region and the second gate region and has an end below an isolation structure between the second gate region and the drain region.

4. The structure of claim 1, wherein the first gate region only partially underlies the second gate region and has an end below the second gate region.

5. The structure of claim 1, wherein the transistor further includes a gate link-up region in the semiconductor layer immediately adjacent to the first gate region, positioned laterally immediately adjacent to the channel region, and further separated from the drain region by an isolation structure.

6. The structure of claim 1, wherein the drain region, the source region, the channel region and the buried well region have N-type conductivity and wherein the first gate region and the second gate region have P-type conductivity.

7. The structure of claim 1, wherein the drain region, the source region, the channel region and the buried well region have P-type conductivity and wherein the first gate region and the second gate region have N-type conductivity.

8. A method comprising:

providing a semiconductor layer, wherein the semiconductor layer includes a semiconductor substrate;

forming a buried well region in the semiconductor substrate; and forming a transistor above the buried well region and including, within the semiconductor layer:

a channel region;

a drain region and a source region above the channel region;

a first gate region below the channel region; and a second gate region above the channel region positioned laterally between the drain region and the source region, wherein the first gate region underlies the drain region and is offset horizontally from the source region and at least a portion of the second gate region adjacent to the source region, and wherein, on the buried well region, the channel region is positioned laterally adjacent to the first gate region and further extends over the first gate region.

9. The method of claim 8, wherein the first gate region has an end either below an isolation structure between the drain region and the second gate region or below the second gate region.

* * * * *